United States Patent
Lane et al.

(10) Patent No.: US 6,323,677 B1
(45) Date of Patent: *Nov. 27, 2001

(54) PROGRAMMABLE LOGIC DEVICE CIRCUITRY FOR IMPROVING MULTIPLIER SPEED AND/OR EFFICIENCY

(75) Inventors: Christopher F. Lane, Campbell; Srinivas T. Reddy, Fremont; Richard G. Cliff, Milpitas; Ketan H. Zaveri, San Jose; Bruce B. Pedersen, San Jose; Kerry Veenstra, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/542,211

(22) Filed: Apr. 4, 2000

Related U.S. Application Data

(63) Continuation of application No. 09/094,387, filed on Jun. 9, 1998, now Pat. No. 6,069,487.
(60) Provisional application No. 60/062,965, filed on Oct. 14, 1997.

(51) Int. Cl.[7] ................................................ H03K 19/173
(52) U.S. Cl. ................................................ 326/37; 326/39
(58) Field of Search ........................... 326/37, 39, 41, 326/47

(56) References Cited

U.S. PATENT DOCUMENTS

| | | | |
|---|---|---|---|
| 5,396,127 | 3/1995 | Chan et al. | 326/39 |
| 5,455,525 * | 10/1995 | Ho et al. | 326/41 |
| 5,550,782 * | 8/1996 | Cliff et al. | 365/230.03 |
| 5,570,039 | 10/1996 | Oswald et al. | 326/39 |
| 5,859,542 | 1/1999 | Pedersen | 326/39 |
| 5,909,126 | 6/1999 | Cliff et al. | 326/41 |
| 5,999,015 | 12/1999 | Cliff et al. | 326/39 |

OTHER PUBLICATIONS

"Implementing Multipliers with Actel FPGAs", Application Note, pp. 4–73 through 4–80, Actel Corporation, Apr. 1996.

"Multipliers in ORCA OR2CxxA/OR2TxxA FPGAs", Microelectronics Application Note, pp. 1–8, Lucent Technologies Inc., May 1996.

"Implementing and Optimizing Multipliers in ORCA FPGAs", Microelectronics Group Application Note, pp. 1–12, Lucent Technologies Inc., Feb. 1997.

* cited by examiner

*Primary Examiner*—Michael Tokar
*Assistant Examiner*—James H. Cho
(74) *Attorney, Agent, or Firm*—Fish & Neave; Robert R. Jackson; Joo-Youn Park

(57) ABSTRACT

In order to facilitate the performance of multiplications in programmable logic devices, individual logic modules of such devices are constructed so that one logic module can perform (at least) both one place of binary multiplication and one place of full binary addition. This makes it possible to reduce the number of logic modules that are required to perform a multiplication. It also reduces the number of inter-module connections employed in a multiplication, thereby tending to decrease the time required to perform a multiplication.

20 Claims, 11 Drawing Sheets

|  | RMULT | RACCUM | RSELC | RSELCNT |
|---|---|---|---|---|
| ACCUMULATOR | 0 | 1 | 0 | 0 |
| MULTIPLIER | 1 | 0 | 0 | 0 |
| MULTIPLIER-ACCUMULATOR | 1 | 1 | 0 | 0 |
| COUNTER | 0 | 1 | 0 | 1 |
| ARITHMETIC | 0 | 0 | 0 | 0 |

|  | RDCMULT | RACCUM | RSELC | RSELCNT | RDCNMULT |
|---|---|---|---|---|---|
| ACCUMULATOR | 0 | 1 | 0 | 0 | 0 |
| MULTIPLIER | 1 | 0 | 0 | 0 | 0 |
| MULTIPLIER-ACCUMULATOR | 1 | 1 | 0 | 0 | 0 |
| COUNTER | 0 | 1 | 0 | 1 | 1 |
| CASCADE | 1 | 0 | 1 | 0 | 1 |
| ARITHMETIC | 0 | 0 | 0 | 0 | X |

|       | 0 | 1 | 2 | 3 | 4 |
|-------|---|---|---|---|---|
| $P_0$ | 0 | 1 | 1 | 0 | 1 |
| $P_1$ | 0 | 0 | 1 | 1 | 0 |
| $P_2$ | 0 | 0 | 0 | 1 | 1 |
| $P_3$ | 0 | 1 | 1 | 0 | 0 |
| $P_4$ | 0 | 0 | 1 | 1 | 1 |
| $P_5$ | 0 | 0 | 0 | 1 | 1 |
| $P_6$ | 0 | 0 | 0 | 0 | 1 |
| $P_7$ | 0 | 0 | 0 | 0 | 0 |

FIG.11

PROGRAMMABLE LOGIC DEVICE CIRCUITRY FOR IMPROVING MULTIPLIER SPEED AND/OR EFFICIENCY

This application claims the benefit of U.S. provisional patent application No. 60/062,965, filed Oct. 14, 1997. This application is also a continuation of application Ser. No. 09/094,387, filed Jun. 9, 1998, now U.S. Pat. No. 6,069,487, which is hereby incorporated by reference herein in its entirety.

BACKGROUND OF THE INVENTION

This invention relates to programmable logic array integrated circuit devices, and more particularly to improving the speed and/or efficiency with which such devices can perform multiplication.

A typical programmable logic device (see, for example, Cliff et al. U.S. Pat. No. 5,909,126, and Cliff et al. U.S. Pat. No. 5,999,015, both of which are hereby incorporated by reference herein) includes a large number of relatively small "modules" of programmable logic and various types of programmably controlled interconnection conductors and other circuit elements for selectively conveying signals to, from, and between the logic modules. Each logic module is programmable to perform any of several relatively small logic tasks. But extremely complex logic can be performed by the device as a whole by interconnecting the logic modules to one another via the interconnection conductors and related circuitry.

In many known programmable logic devices, each logic module can be programmed to perform one place of binary addition on two addend signals and a carry in signal in order to produce a sum out signal and a carry out signal. This is true, for example, of the representative logic module shown in FIG. 2 of above-mentioned U.S. Pat. No. 5,999,015. A frequently occurring elemental operation in binary multiplications, however, involves Adding a multiplicand bit and a multiplier bit to produce one of two addends that are to be added together with a carry in bit to produce a sum out bit and a carry out bit. Because a logic module as described above cannot perform both an AND operation and one place of binary addition, two logic modules are required to perform one elemental multiplication operation of the type mentioned in the immediately preceding sentence.

Some elemental operations in a multiplication are even more complex than those mentioned above. These operations require two separate AND operations on two sets of two multiplicand/multiplier bits. The outputs of the two AND operations are two addend bits that must be added together with a carry in bit to produce sum out and carry out bits. Again, because logic modules of the type described above cannot perform more than one two-input AND or one place of binary addition, three logic modules are required to perform an elemental multiplication operation of the type mentioned in the three immediately preceding sentences.

It will be seen from the foregoing that multiplications tend to require large numbers of logic modules on a programmable logic device. And because many of the elemental multiplication operations involved require two or even three logic modules which must be interconnected via interconnection conductors and related circuitry, multiplications tend to be slowed down by the need to pass signals through the interconnection conductors as part of most of the elemental operations, as well as between elemental operations.

In view of the foregoing, it is an object of this invention to provide improved programmable logic device circuitry for performing multiplication.

It is a more particular object of this invention to reduce the number of logic modules on a programmable logic device that are required to perform multiplication.

It is another more particular object of this invention to provide programmable logic circuitry which can perform multiplication more rapidly.

SUMMARY OF THE INVENTION

These and other objects of the invention are accomplished in accordance with the principles of the invention by providing programmable logic device logic modules which are modified or augmented with additional circuitry which makes it possible to perform more of the elemental operations that are required in multiplication in a single logic module. For example, an AND gate and associated programmable logic connector ("PLC") circuitry may be provided in an input stage to each logic module. When a logic module is to be used in a multiplication, this circuitry can be programmed to allow two inputs to the logic module to be preliminarily added to thereby form the product of those two inputs. The output of the AND gate is then applied to the remainder of the logic module, which is programmed as a full adder to add the AND gate output, another input to the logic module, and a carry in input to the logic module in order to produce sum out and carry out output signals of the logic module. A single augmented logic module is thus able to both multiply two multiplicand/multiplier bits and perform an associated full adder operation. Accordingly, each such logic module can perform an elemental multiplication operation that would have required two conventional logic modules to perform. In addition to conserving logic modules, multiplication speed is increased to the extent that the interconnection conductor resources of the programmable logic device do not have to be used to connect two logic modules that are performing parts of one elemental multiplication operation.

In some embodiments two parallel AND gates may be provided in an input stage to each logic module so that the logic module can perform two preliminary multiplications followed by full addition of the resulting product signals (with carry in, sum out, and carry out being employed or produced as in the preceding paragraph).

The several logic modules in a group of logic modules may receive an input signal in parallel, which can be one input to the above-mentioned AND gate in each logic module. This input signal can be a multiplier bit which is needed in common by several logic modules. If each logic module has two AND gates, then two different multiplier bit signals can be supplied in parallel to all of the logic modules. One of these signals is applied to one input terminal of one of the AND gates in each logic module, and the other of these signals is applied to one input terminal of the other AND in each logic module.

Each logic module may include a flip-flop for enabling the logic module to perform as one stage of a multiplier-accumulator. Several such multiplier-accumulator stages can be interconnected to perform multi-bit multiplication over several successive cycles of a periodic signal which is used to clock the flip-flops. Multiplications can be performed in very small numbers of logic modules by using such multiplier-accumulator arrangements.

Further features of the invention, its nature and various advantages will be more apparent from the accompanying drawings and the following detailed description of the preferred embodiments.

BRIEF DESCRIPTION OF THE DRAWINGS

FIG. 4 is a table useful in explaining certain operating conditions of the FIG. 3 circuitry.

FIG. 6 is a table useful in explaining certain operating conditions of the FIG. 5 circuitry.

FIG. 11 is a table of successive data values which is useful in explaining the operation of the logic shown in FIG. 10.

DETAILED DESCRIPTION OF THE PREFERRED EMBODIMENTS

Figure 1:
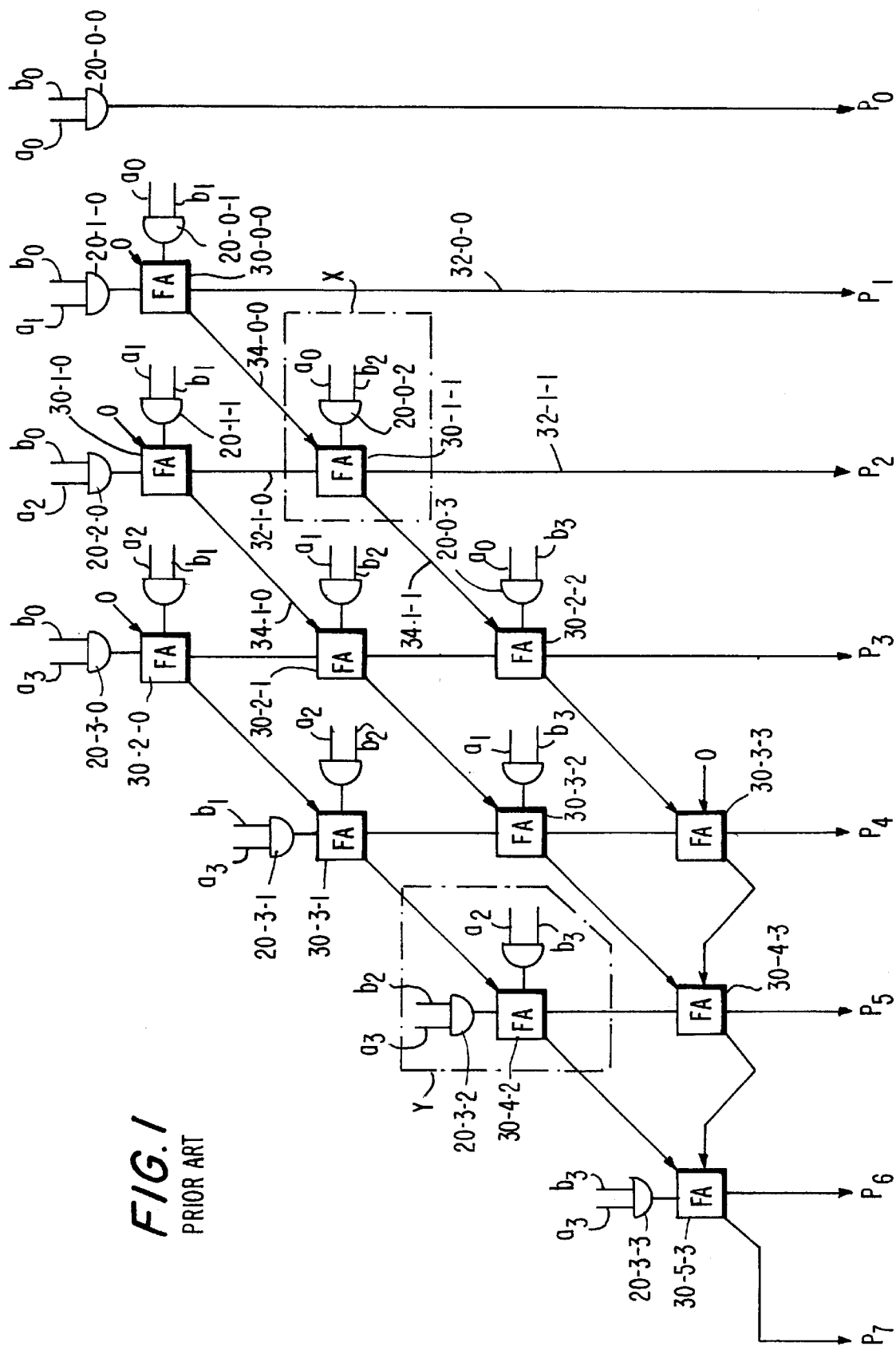
FIG. 1 is a simplified schematic block diagram showing how multiplication of two four-digit binary numbers may be conventionally performed.

FIG. 1 shows how two four-digit binary numbers may be conventionally multiplied. From most-to least-significant, the four bits of multiplicand "a" are designated $a_3$ through $a_0$, and the four bits of multiplier "b" are designated $b_3$ through $b_0$. (It should be noted that it does not matter which number is designated "multiplicand" and which number is designated "multiplier," because these two numbers can be reversed with absolutely no change in the result, as is true for any multiplication. Thus, for simplicity of terminology, both the multiplicand and the multiplier will sometimes be referred to herein as multipliers.) Similarly, from most- to least-significant, the eight bits of the product are designated $p_7$ through $p_0$.

FIG. 1 shows that $p_0$ is the logical AND (or product) of ao and bo formed by AND gate 20-0-0.

The next product bit $p_1$ is the sum of the product of $a_1$ and $b_0$ and the product of $a_0$ and $b_1$. The product of $a_1$ and $b_0$ is formed by AND gate 20-1-0. The product of $a_0$ and $b_1$ is formed by AND gate 20-0-1. Full adder 30-0-0 adds the output signals of these two AND gates and produces sum out signal 32-0-0 and carry out signal 34-0-0. Sum out signal 32-0-0 is product bit $p_1$ while carry out signal 34-0-0 is the carry in signal to full adder 30-1-1. (The carry in signal to full adder 30-0-0 is fixed at logic 0 as is shown at the upper right-hand corner of that component.)

AND gate 20-2-0 forms the product of $a_2$ and $b_0$. AND gate 20-1-1 forms the product of $a_1$ and $b_1$. Full adder 30-1-0 adds the output signals of these two AND gates to produce sum out signal 32-1-0 and carry out signal 34-1-0. Sum out signal 32-1-0 is applied to full adder 30-1-1, while carry out signal 34-1-0 is applied as a carry in signal to full adder 30-2-1. (Again, the carry in signal to full adder 30-1-0 is fixed at logic 0.) AND gate 20-0-2 forms the product of $a_0$ and $b_2$. Full adder 30-1-1 adds the sum out signal 32-1-0 from full adder 30-1-0, the carry out signal 34-0-0 from full adder 30-0-0, and the output signal of AND gate 20-0-2 to produce sum out signal 32-1-1 and carry out signal 34-1-1. Sum out signal 32-1-1 is product bit $P_2$. Carry out signal 34-1-1 is the carry in signal to full adder 30-2-2.

The foregoing explanation of the three right-hand-most columns of FIG. 1 will suffice to make it apparent how the remainder of the logic shown in that FIG. operates.

The logic shown in FIG. 1 can be broken down into several types of elemental multiplication operations. One type of elemental operation is indicated representatively by the box X in FIG. 1. This type operation includes forming a product of two bits using an AND gate, and then adding the resulting product bit together with another addend and a carry in bit in a full adder in order to produce a sum out bit and a carry out bit. Another type of elemental multiplication operation is indicated representatively by the box Y in FIG. 1. This operation includes forming two product bits using two AND gates, and using a full adder to add those two product bits together with a carry in bit to produce a sum out bit and a carry out bit.

Figure 2:
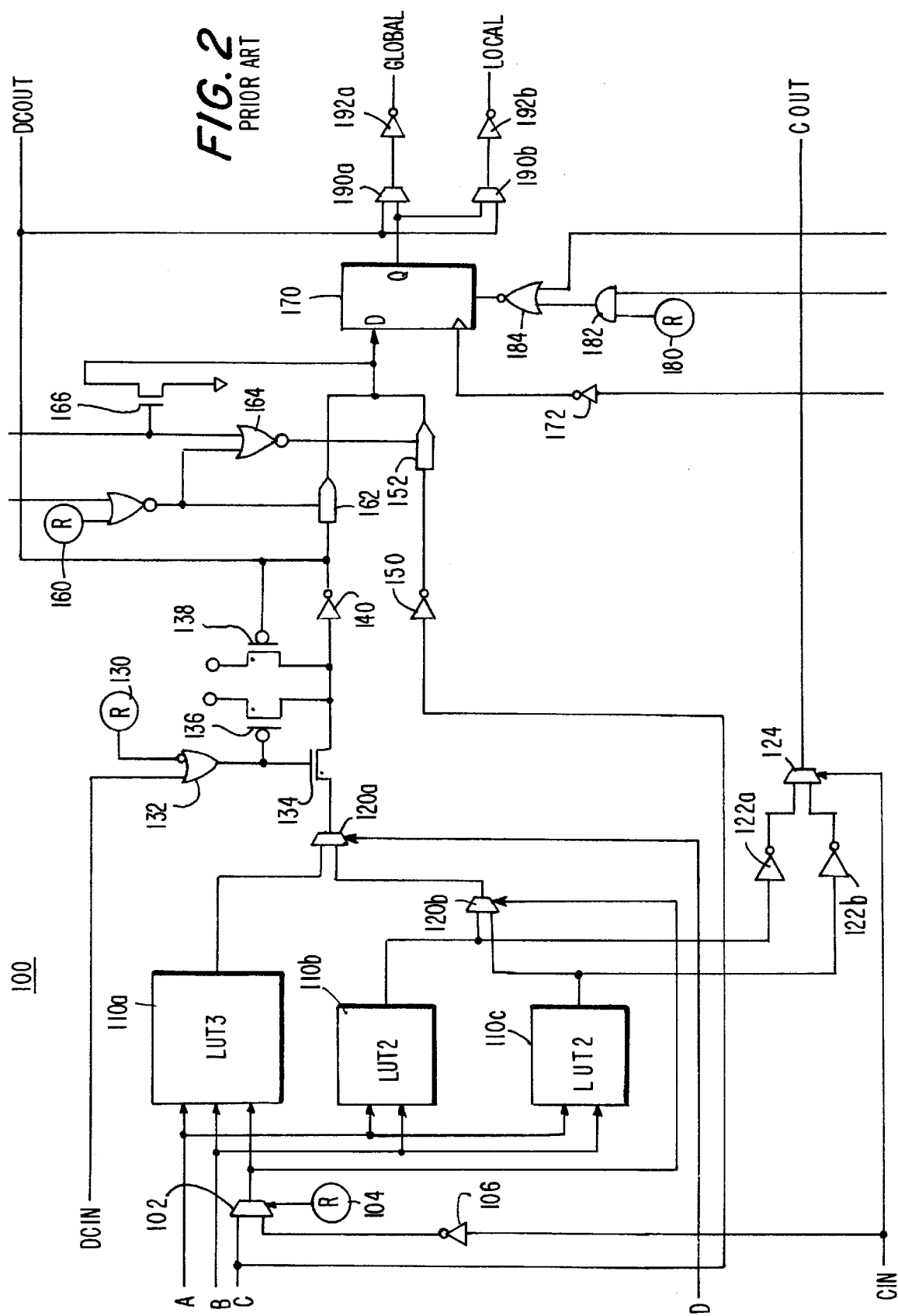
FIG. 2 is a simplified schematic block diagram of an illustrative, known logic module for use in a programmable logic device.

FIG. 2 shows a known programmable logic device logic module 100 (similar to the logic module shown in FIG. 2 of above-mentioned U.S. Pat. No. 5,999,015) which can be programmed to operate either as an AND gate or as full adder (among many other possible alternative functions), but which is not capable of performing both of those functions.

Logic module 100 has four primary data inputs A–D, a carry in input CIN and a direct connect input DCIN. Logic module 100 includes a programmable, three-input look-up table 110a, and two programmable, two-input look-up tables 110b and 110c. Each look-up table 110 is programmable to produce an output signal which is any logical combination of the inputs to that look-up table. Inputs A and B are applied to each of look-up tables 110. Programmable logic connector ("PLC") 102 is programmable by function control element ("FCE") 104 to output either input C or the inverted carry in signal. Inverter 106 inverts the carry in signal for application to PLC 102. The output signal of PLC 102 is the third input to look-up table 110a and also to the control input terminal of PLC 120b. Input D is applied to the control input of PLC 120a. The output signal of look-up table 110a is applied to one data input of PLC 120a. The output signals of look-up tables 110b and 110c are applied to the data input terminals of PLC 120b and also to inverters 122a and 122b. The output signals of inverters 122 are applied to the data inputs of PLC 124. The carry in signal is applied to the control input of PLC 124.

When logic module 100 is to be used to perform one place of binary addition, inputs A and B are used for the two addend bits, and FCE 104 is programmed to cause PLC 102 to apply the inverted carry in bit (from another adjacent or nearby logic module) to the third input of look-up tables 110a. Look-up table 110a is programmed so that its output signal is the sum of the A, B, and carry in inputs, and input D is used to control PLC 120a to pass the output of look-up table 110a. Look-up tables 110b and 110c are programmed to cooperate with inverters 122 so that the signal selected by PLC 124 in response to the carry in signal is the carry out signal COUT that results from adding inputs A, B, and CIN.

It will be understood that using logic module 100 to perform one place of binary addition is only one possible use of that circuitry. For example, look-up table 100 can be used together with elements 120a and 120b to provide a four-input look-up table (i.e., a look-up table which can be programmed to provide an output signal from PLC 120a which is any logical combination of inputs A–D).

The remainder of the circuitry shown in FIG. 2 is less immediately relevant to this part of the discussion and so it can be described more briefly. (Additional information regarding this circuitry can be found in above-mentioned U.S. Pat. No. 5,999,015.) Elements 130–140 are usable to programmably allow the output signal of PLC 120a to be logically combined with a direct connect input signal DCIN from another adjacent or nearby logic module. The output signal of inverter 140 is the direct connect output signal DCOUT of logic module 100, and also one of two data inputs to PLCs 190a and 190b. Elements 150–166 allow various signals such as either the output signal of inverter 140 or the inverted C input to be applied to the data input terminal of flip-flop 170. Element 172 is used in clocking flip-flop 170. Elements 180–184 are usable in selectively clearing flip-flop 170. The data output signal of flip-flop 170 is the second data input signal to each of PLCs 190a and 190b. The output signals of PLCs 190a and 190b are respectively applied to inverters 192a and 192b. The outputs of inverters 192a and 192b may be respectively applied to different portions of the interconnection circuitry of the programmable logic device which includes logic module 100. For example, the output signal of inverter 192a may be applied to relatively long-distance ("global") interconnection conductors, while the output signal of inverter 192b may be applied to shorter-distance ("local") interconnection conductors. From the foregoing, it will be seen that either of the global or local outputs can be either the output of inverter 140 (a so-called "combinatorial" output of the logic module) or the output of flip-flop 170 (a so-called "registered" output of the logic module).

The discussion of FIG. 2 that has been provided will make it apparent that logic module 100 can be programmed to function as a full adder, producing the sum out and carry out bits that result from adding the two addend bits (A and B) and a carry in bit (CIN). If desired, the sum out bit can be registered by flip-flop 170. Alternatively, logic module 100 can be programmed to produce the logical AND of any two of its inputs A–D. However, logic module 100 cannot perform both of these functions in the manner required to perform an elemental multiplication operation of the type shown in box X in FIG. 1.

Figure 3:
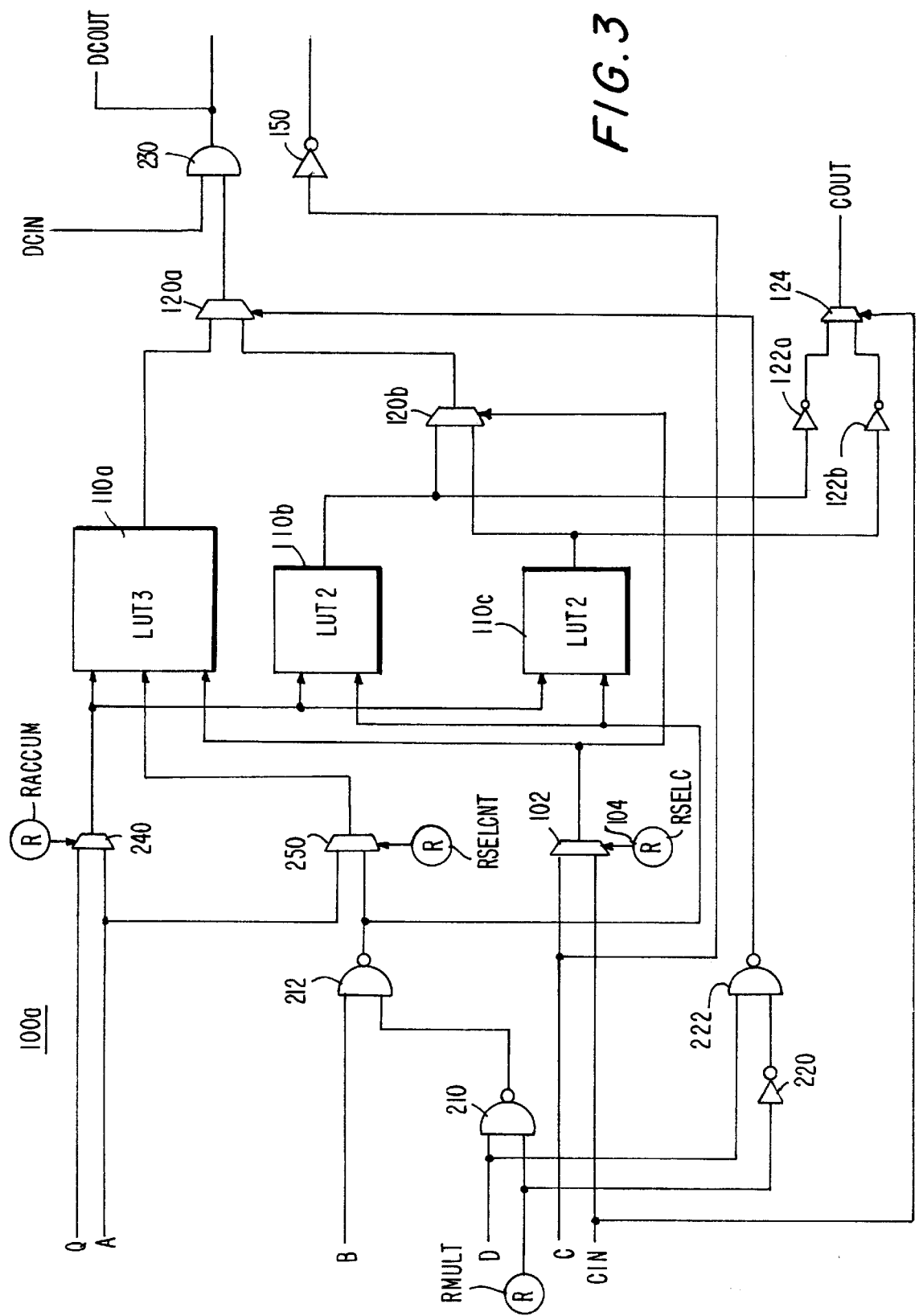
FIG. 3 is a simplified schematic block diagram showing illustrative modification of a portion of the FIG. 2 circuitry in accordance with this invention.

FIG. 3 shows an illustrative embodiment of circuitry that can be added to a logic module of the type shown in FIG. 2 to enable the augmented logic module 100a to form a product of two of its inputs, and to then use that product as one of two addends to a full adder which also receives a carry in bit. When FCE RMULT is programmed logic 1, NAND gate 210 passes logic module input D to NAND gate 212 in inverted form. NAND gate 212 is thus able to produce an output signal which is indicative of the product of inputs B and D. (PLC 250 is controlled as described in more detail below to apply the output signal of NAND gate 212 to one input of look-up table 110a). The remainder of logic module 110a is configured and programmed to operate as a full adder, adding the A input, the output of NAND gate 212, and a carry in signal CIN to produce a sum out signal from PLC 120a and a carry out signal COUT from PLC 124. To cause PLC 120a to select the sum out signal from look-up table 110a, the logic 1 output of FCE RMULT is inverted by inverter 220 and then applied to one input of NAND gate 222. This forces the output of NAND gate 222 to logic 1, which causes PLC 120a to pass the output signal of look-up table 110a. AND gate 230 in FIG. 3 is a simplified representation of the logic performed by elements 130–140 in FIG. 2, and it will be understood that this element 230 can actually be implemented as shown at 130–140 in FIG. 2. Similarly, to the right of elements 230 and 150 the circuitry of logic module 100a may continue as shown to the right of elements 140 and 150 in FIG. 2. Thus logic module 100a typically includes the same flip-flop and other circuitry shown on the right in FIG. 2, and those elements can all operate as described above in connection with FIG. 2.

If it is not desired to use NAND gate 212 to produce a signal indicative of the product of inputs B and D, then FCE RMULT is programmed logic 0. This allows NAND gate 212 to merely pass input B (with inversion), and it allows input D to control PLC 120a. Logic module 100a thereby becomes like logic module 100 (e.g., capable of functioning as a full adder or a four-input look-up table).

If desired, logic module 100a may include the additional circuit elements that will now be discussed with the aid of FIG. 4 to give the logic module additional capabilities. FIG. 4 shows several possible combinations of the states of FCEs RMULT, RACCUM, RSELC, and RSELCNT. The logic module function associated with each combination is shown on the right in FIG. 4. (There are other possible combinations of the states of these FCEs which are not shown in FIG. 4 because they are not particularly important to the invention. For example, to use logic module 100a as a four-input look-up table, FCE, RSELC is programmed logic 1 to cause PLC 102 to select the C input (rather than CIN) for application to one input of look-up table 110a and to the control input of PLC 120b.)

As shown in the first line of FIG. 4, logic module 100a can be made to function as an accumulator by programming FCE RACCUM logic 1, while FCEs RMULT, RSELC, and RSELCNT are programmed logic 0. Programming RACCUM logic 1 causes PLC 240 to apply the Q output of the flip-flop 170 in the logic module to one input of look-up table 110a in lieu of input A. The other FCEs shown in FIG. 3 are all logic 0, so logic module 100a functions as a full adder to add Q, B, and CIN in order to produce a sum out signal from PLC 120a and a carry out signal COUT from PLC 124. The sum out signal is applied to the flip-flop 170 of the logic module. The logic module thereby acts as an accumulator, adding its starting value of Q to inputs B and CIN and storing the sum out result.

The second line in FIG. 4 corresponds to multiplier operation of logic module 100a described above.

The third line in FIG. 4 allows logic module 100a to function as one stage of a multiplier-accumulator. NAND gate 212 produces an output signal indicative of the product of the B and D inputs. The remainder of the logic module adds this product to the Q output of its flip-flop 170 and carry in signal CIN. The resulting sum out signal is used to update the contents of the flip-flop, and a carry out signal COUT is also produced.

The fourth line in FIG. 4 allows logic module 100a to function as one stage of a counter. PLC 240 is controlled by RACCUM to pass the Q output of the logic module's flip-flop 170. PLC 250 is controlled by RSELCNT to pass the A input. The programming of RMULT allows NAND gate 212 to pass the B input, and similarly allows NAND gate 222 to pass the D input. PLC 102 is controlled by RSELC to pass CIN. Input A is used to determine whether the logic module counts during a given clock cycle. Input B determines the direction of counting (i.e., whether up or down). The current count is stored in the flip-flop 170 of the logic module.

The fifth line in FIG. 4 corresponds to the full adder mode of operation of the logic module (without multiplication of inputs B and D). This mode of operation has already been described and need not be described again here.

Figure 5:
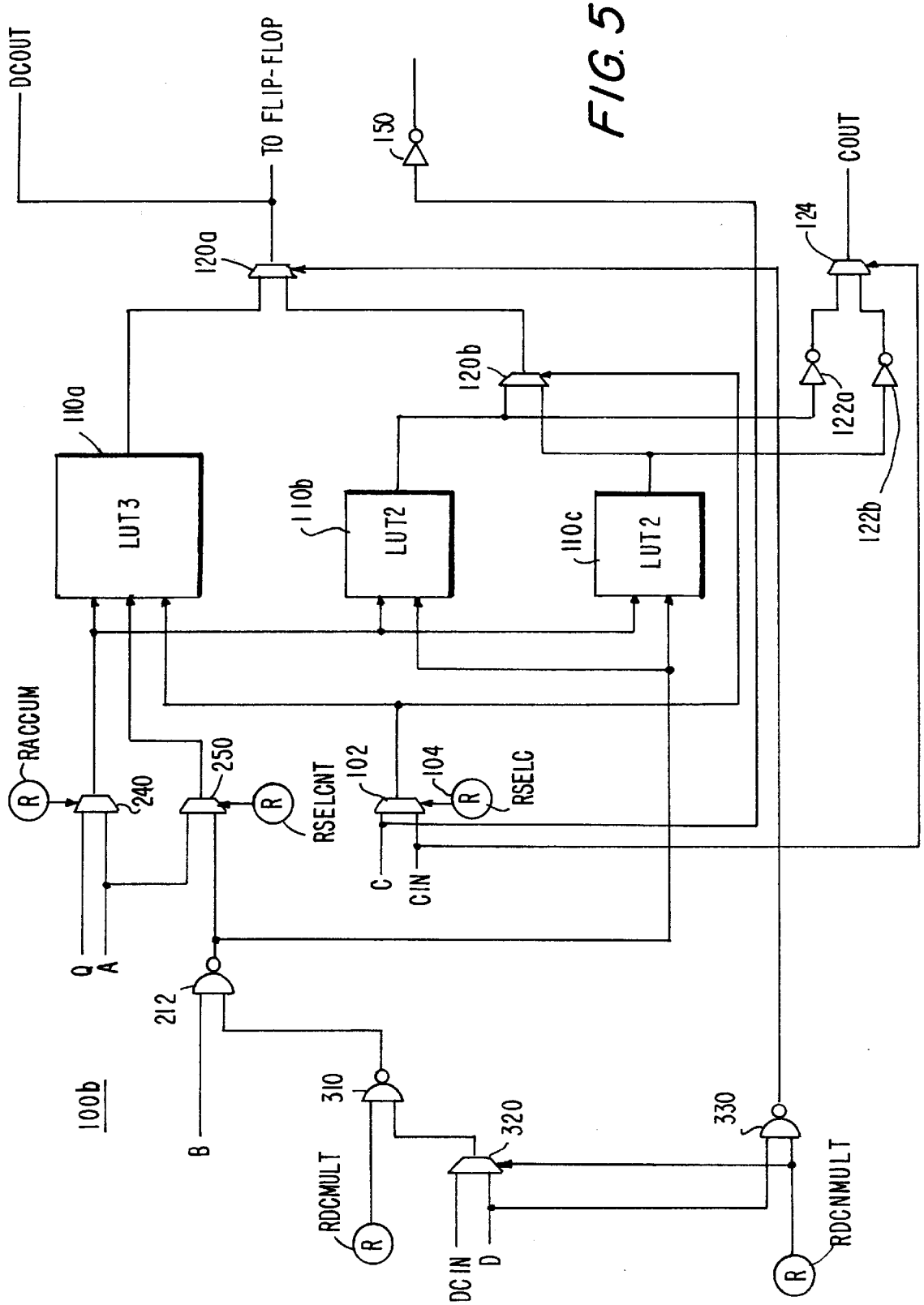
FIG. 5 is a simplified schematic block diagram showing another illustrative modification of a portion of the FIG. 2 circuitry in accordance with the invention.

FIG. 5 shows an alternative embodiment in which the AND logic that is added to the logic module to perform a multiplication is alternatively usable to perform the AND function associated with use of the direct connect DCIN signal. This effectively reduces the number of AND gates that must be added (as compared to logic module 100) to add multiplier capability to the logic module. (As in the case of FIG. 3, the circuitry of logic module 100b in FIG. 5 continues to the right as shown on the right in FIG. 2.) FIG. 6 shows several of the possible state combinations for the FCEs in FIG. 5 and the type of operation of logic module 100b associated with each combination. An X in FIG. 6 denotes a "don't care" value (can be either logic 1 or logic 0). As in the case of FIG. 4, there are other possible combinations of FCE states that are not shown in FIG. 6 but that are less immediately relevant to the present invention and so do not have to be described in detail herein. For example, another combination of FCE states allows logic module 100b to be used as a general-purpose four-input look-up table without use of direct connect input DCIN.

The first line in FIG. 6 corresponds to use of logic module 100b as an accumulator. FCE RDCMULT is programmed logic 0, which forces the output of NAND gate 310 to logic 1. This allows NAND gate 212 to pass input B (in inverted form). FCE RACCUM is programmed logic 1, which causes PLC 240, to apply the Q output of the logic module's flip-flop 170 to one input of each of look-up tables 110. FCE RSELC is programmed logic 0, which causes PLC 102 to apply carry in signal CIN to one input of look-up table 110a and to the control input of PLC 120b. FCE RSELCNT is programmed logic 0, which causes PLC 250 to apply the output signal of NAND gate 212 to one input of look-up table 110. FCE RDCNMULT is programmed logic 0, which causes NAND gate 330 to output logic 1, thereby causing PLC 120a to select the output signal of look-up table 110a as its output. From the foregoing it will be seen that in the accumulator mode logic module 100b adds the Q output of its flip-flop 170 to its B and CIN inputs, and stores the sum out result as a new value in its flip-flop, as well as producing a carry out signal COUT.

The second line in FIG. 6 corresponds to use of logic module 100b as a multiplier. FCE RDCMULT is programmed logic 1, which allows NAND gate 310 to pass the output signal of PLC 320 in inverted form. FCE RDCN-MULT is programmed logic 0, which causes PLC 320 to select the D input as the signal applied to NAND gate 310. Because NAND gate 310 is enabled to output a signal indicative of the D input, NAND gate 212 is able to produce an output signal indicative of the product of inputs B and D. FCE RSELCNT is programmed logic 0, which causes PLC 250 to apply the product signal from NAND gate 212 to look-up table 110a. The product output signal of NAND gate 212 is also applied to look-up tables 110b and 110c. FCEs RACCUM and RSELC are programmed logic 0 so that logic module 100b does not act as an accumulator and so that it selects its carry in signal CIN for application to look-up table 110a and the control input of PLC 120b. The logic 0 signal from FCE RDCNMULT causes PLC 120a to select the output signal of look-up table 110a. Accordingly, look-up tables 110 can be programmed to cause logic module 100b to operate as a full adder which adds the product output signal from NAND gate 212 to the A and carry in inputs in order to produce a sum out signal from PLC 120a and a carry out signal COUT from PLC 124.

The third line of FIG. 6 corresponds to operation of logic module 100b as a multiplier-accumulator. This mode of operation is basically similar to the above-described multiplier mode of operation, except that programming FCE RACCUM logic 1 causes PLC 240 to select the Q output of the logic module's flip-flop 170 instead of the A input for addition to the product output signal of NAND gate 212 and the carry in signal CIN.

The fourth line in FIG. 6 corresponds to operation of logic module 100b as a counter. Programming FCE RDCMULT logic 0 turns off the multiplier operation of NAND gate 212 by forcing the output of NAND gate 310 to logic 1, which causes NAND gate 212 to merely pass input B with an inversion. Programming RACCUM logic 1 causes PLC 240 to pass the Q output of the logic module's flip-flop 170. Programming RSELCNT logic 1 causes PLC 250 to pass input A. RSELC is programmed logic 0 to cause PLC 102 to pass the carry in signal CIN. RDCNMULT is programmed logic 1 to cause NAND gate 330 to pass input D with an inversion. Input D is maintained at logic 0 to cause PLC 120a to select the output signal of look-up table 110a. Look-up tables 110 are programmed so that logic module 100b combines Q, A, and CIN in a sense indicated by input B in order to provide an up or down counter. In other words, the direction of counting is indicated by input B, and counting is enabled by input A.

The fifth line of FIG. 6 corresponds to the use of logic module 100b in the cascade or direct connect mode. RDC-NMULT is programmed logic 1 to cause PLC 320 to pass the direct connect input DCIN and to enable AND gate 330 to pass input D (with inversion). RDCMULT is programmed logic 1 to enable NAND gate 310 to pass the output of PLC 320 (with inversion). NAND gate 212 is thereby enabled to logically combine DCIN and input B. RACCUM is programmed logic 0 to disable the accumulator mode. RSELCNT is programmed logic 0 to disable the counter mode. RSELC is programmed logic 1 to select input C rather than carry in input signal CIN. Logic module 100b is therefore operable as a four-input look-up table with a direct connection input DCIN being logically combined with one of those inputs (i.e., input B).

The last line of FIG. 6 corresponds to use of logic module 100b as a full adder. RDCMULT is programmed logic 0 to force the output of NAND gate 310 to logic 1. This enables NAND gate 212 to pass input B (with inversion). RACCUM is programmed logic 0 to disable the accumulator mode. RSELC is programmed logic 0 to cause PLC 102 to pass the carry in signal CIN. RSELCNT is programmed logic 0 to cause PLC 250 to apply the output signal of NAND gate 212 to look-up table 110a. The state of RDCNMULT does not matter because it is effectively over-ridden by input D (which is held at logic 0). Logic module 100b therefore functions as a full adder, adding inputs A, B, and CIN, and producing sum out and carry out signals from PLCs 120a and 124, respectively.

Figure 7:
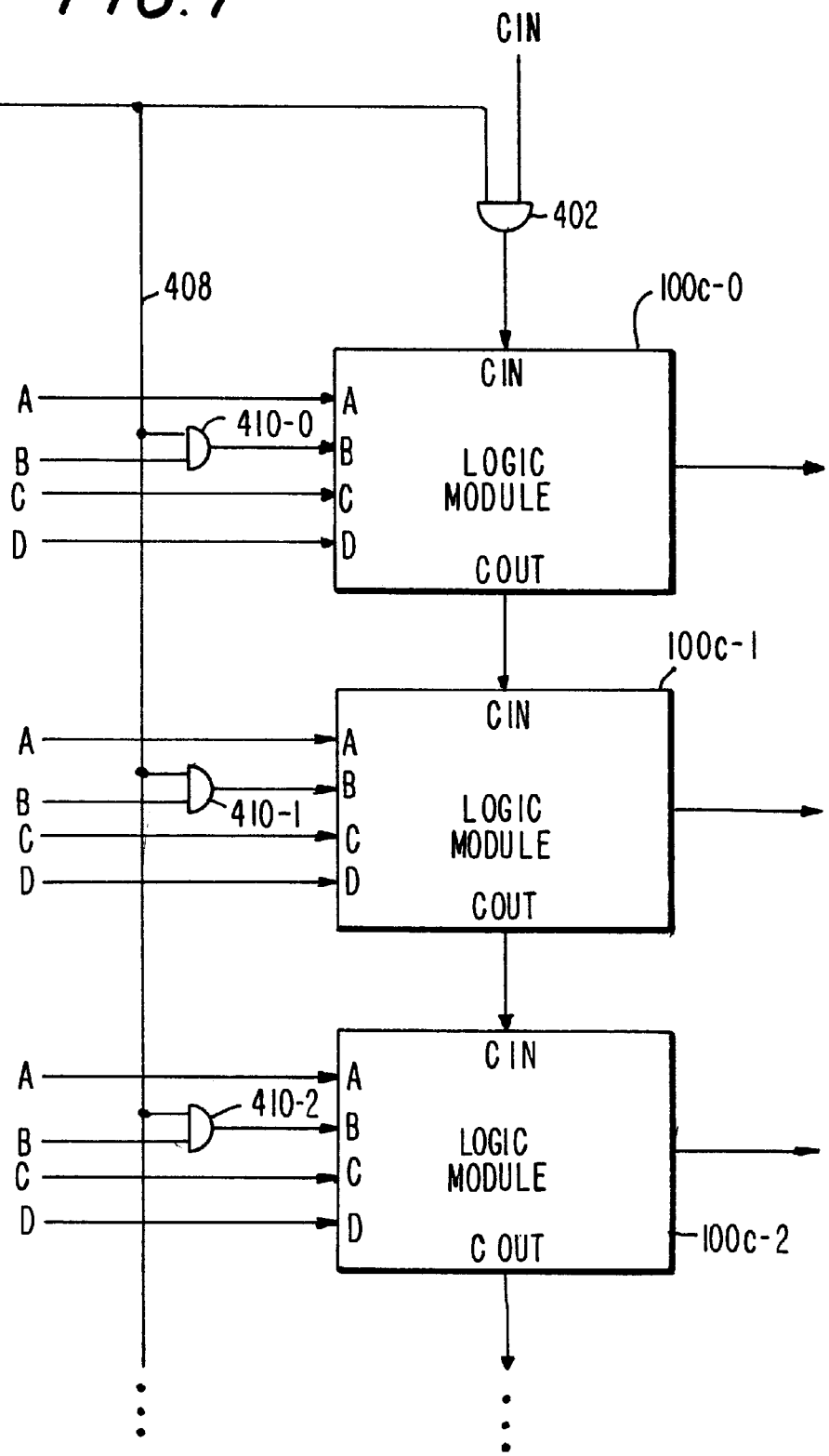
FIG. 7 is a simplified schematic block diagram showing other illustrative modifications of the logic module circuitry of a programmable logic device in accordance with the invention.

FIG. 7 shows another illustrative embodiment which takes advantage of the fact that multiplications are usually several (e.g., eight or more) bits wide. This means that many of the AND gates implementing the multiplication will share a common input. In FIG. 1, for example, all of AND gates 20-0-0, 20-0-1, 20-0-2, and 20-0-3 have $a_0$ as a common input. Indeed, there is a common input for all of the AND gates along each diagonal in FIG. 1. In programmable logic devices the logic modules (e.g., like module 100 in FIG. 2) are frequently grouped in blocks (e.g., of eight or ten). For convenience these blocks may be referred to as logic array blocks or LABs. FIG. 7 shows the use of one LAB-wide signal (in this embodiment called nSYNCLR) which can optionally be used as a common multiplier bit for all of the logic modules 100c-0, 100c-1, 100c-2, etc., in a LAB. When multiplication is not desired, nSYNCLR is logic 1. This allows AND gate 402 to apply the carry in signal CIN received from another adjacent or nearby LAB to the carry in input terminal of the first logic module 100c-0 in the LAB shown in part in FIG. 7. The logic 1 nSYNCLR signal also enables the AND gate 410 associated with each of logic modules 100c to pass the B input signal associated with that logic module to the B input terminal of the logic module.

On the other hand, when multiplication is desired, nSYN-CLR is used to apply one multiplier bit in common to one input terminal of all of AND gates 410. For example, if the LAB shown in part in FIG. 7 is implementing the right-hand-most diagonal in FIG. 1, multiplier bit $a_o$ can be applied via the nSYNCLR lead. The multiplier bits $b_0-b_n$ to be multiplied by $a_o$ are respectively applied to the B inputs to AND gates 410-0, 410-1, 410-2, etc. Thus the output signal of each AND gate 410 is a product bit. The remainder of the logic module 100c receiving each such product bit (via the B input terminal) can be programmed (if necessary) as a full adder to use that product bit as one of two addend bits. Another addend bit can be applied to each logic module via it's a input terminal. And carry chain signals are of course present as shown in FIG. 7. Thus with the addition of an associated AND gate 410, each logic module 100c in FIG. 7 can perform an elemental multiplication operation of the type shown in box X in FIG. 1. (Each logic module 100c in FIG. 7 may be constructed generally as shown in FIG. 2.)

The circuitry shown in FIG. 7 can have a counter mode in which the Q output of each logic module's flip-flop 170 is fed back to the B input to that logic module's AND gate 410. The counter-enable or up/down control comes in on the A input to each logic module 100c. When nSYNCLR is low, the counter will be synchronously cleared.

Further considering possible arithmetic mode operations of the circuitry shown in FIG. 7, one addend to each logic module 100c comes in on the B input to that logic module's AND gate 410. The other addend or accumulator feedback comes in on each logic module's A input. When nSYNCLR is low, 0 will be added to the A input, thus disabling the adder.

Another possible embodiment of circuitry of the general type shown in FIG. 7 is to use conductor 408 as a dedicated multiplier input signal lead (and not additionally as an nSYNCLR signal lead as in FIG. 7). Such a dedicated multiplier input signal lead would not require logical combination with the initial carry in signal (as in AND gate 402 in FIG. 7).

Figure 8:
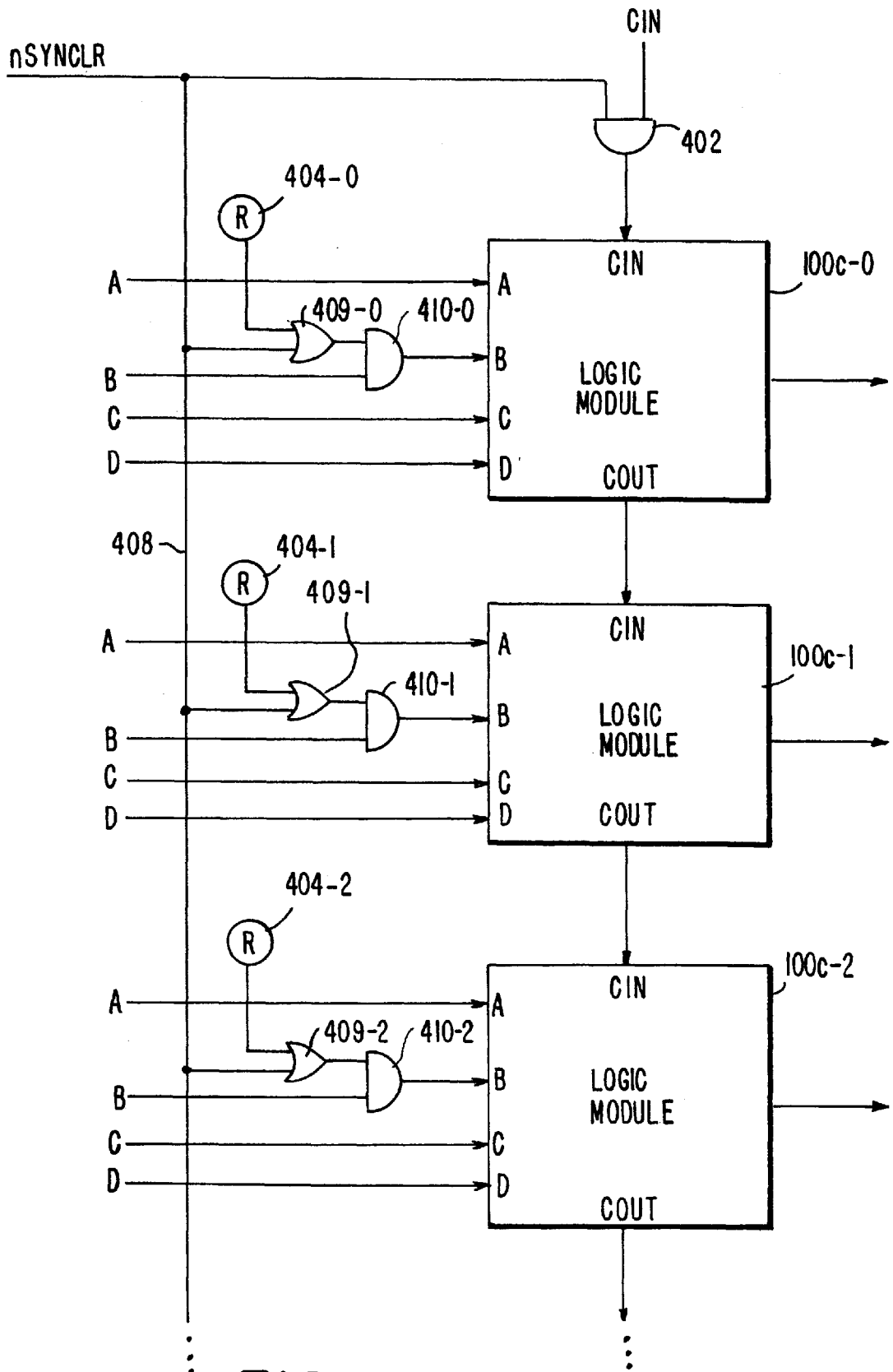
FIG. 8 is another diagram similar to FIG. 7 showing still other illustrative modifications of logic module circuitry in accordance with the invention.

FIG. 8 shows another alternative embodiment of circuitry of the general type shown in FIG. 7. The FIG. 8 embodiment is basically the same as the FIG. 7 embodiment except that in this case the AND gate 410 associated with each logic module 100c is individually enabled by an FCE 404 and an OR gate 409 associated with that logic module. If it is desired to cause a logic module 100c to ignore the signal on lead 408, the FCE 404 for that logic module is programmed logic 1. This causes the associated OR gate 409 output signal to be logic 1 at all times, thereby allowing the associated AND gate 410 to simply pass the B input of the associated logic module 100c. On the other hand, if it is desired for a logic module 100c to use the signal on lead 408 (e.g., as a common multiplier bit or in any of the other ways described above in connection with FIG. 7), then the FCE 404 associated with that logic module is programmed logic 0. This allows the associated OR gate 409 to pass the signal on lead 408 and allows the associated logic module 100c to respond to that signal as described in connection with FIG. 7.

The embodiment shown in FIG. 8 allows logic modules 100c in a LAB that are not needed to perform part of a multiplication to be more easily used for other purposes (e.g., as normal four-input logic cells). As in the case of FIG. 7, still another alternative embodiment of circuitry of the type shown in FIG. 8 has conductor 408 used just for a dedicated common multiplier bit input and not additionally for an nSYNCLR-type signal.

Figure 9:
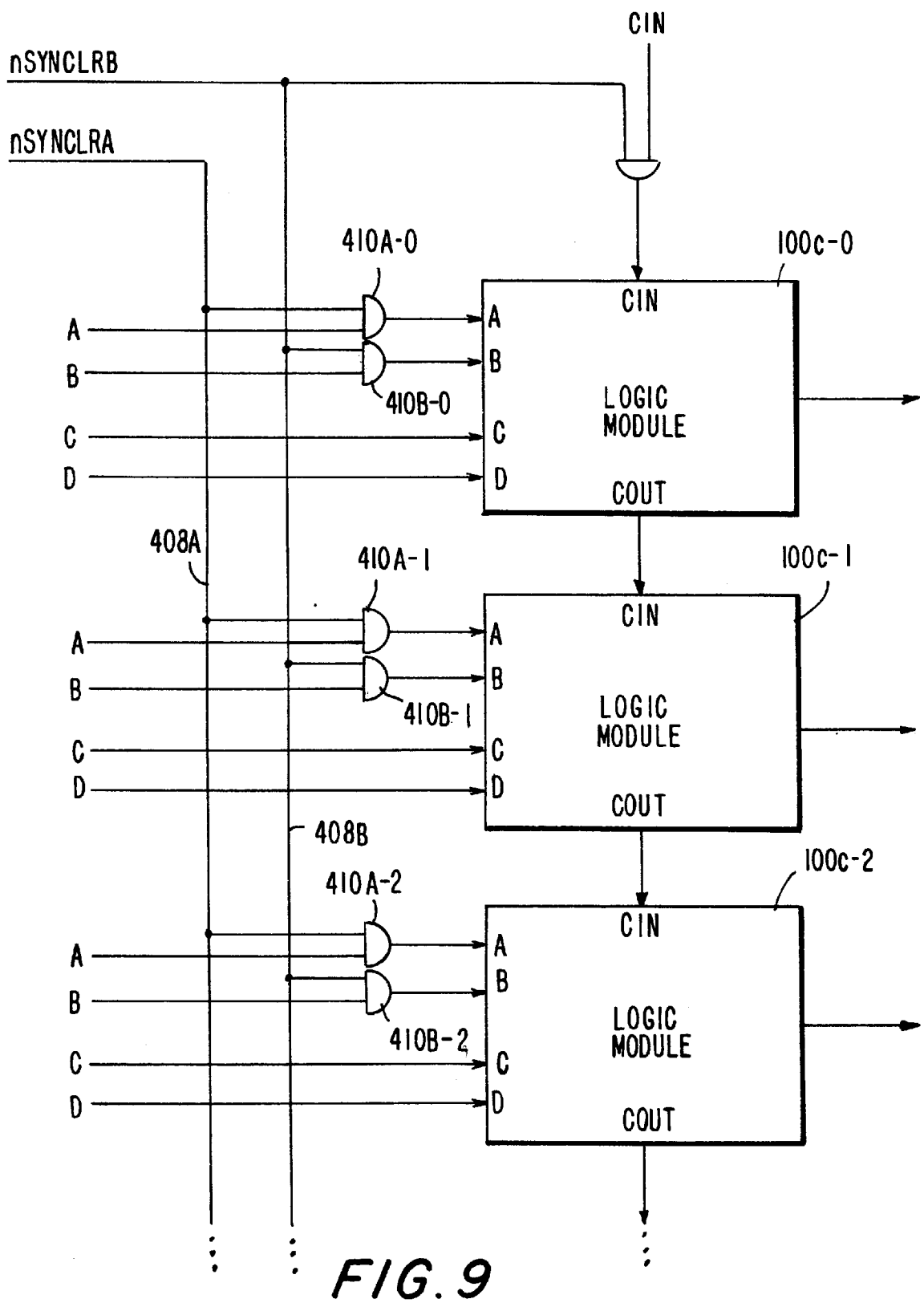
FIG. 9 is still another diagram similar to FIGS. 7 and 8 showing still more illustrative modifications in accordance with the invention.

FIG. 9 shows yet another alternative embodiment which is generally similar to the circuitry shown in FIG. 7. In the embodiment shown in FIG. 9 each logic module 100c has two associated AND gates 410A and 410B. The AND gate 410A associated with each logic module ANDs the A input associated with that logic module and a LAB-wide signal nSYNCLRA. Similarly, the AND gate 410B associated with each logic module ANDs the B input associated with that logic module and a LAB-wide nSYNCLRB signal. Each of the nSYNCLRA and nSYNCLRB signals can be used for a respective common multiplier bit. Thus the circuitry shown in FIG. 9 facilitates performance of elemental multiplier operations of the type shown in box Y in FIG. 1 along the diagonal that includes box Y in that FIG. For example, the nSYNCLRA signal can be used for multiplier bit $a_2$ which is needed in most of the box-Y-type elemental multiplication operations along the left-hand-most diagonal in FIG. 1. At the same time the nSYNCLRB signal can be used for multiplier bit $a_3$ which is needed in all of the box-Y-type elemental multiplication operations along the left-hand-most diagonal in FIG. 1. Each AND gate 410 associated with a logic module 100c in FIG. 9 performs one two-bit multiplication, and the remainder of that logic module performs a full adder operation on the resulting product bits and a carry in bit. Thus the circuitry shown in FIG. 9 allows each logic module 100c (augmented by two AND gates 410A and 410B) to perform one complete elemental multiplication operation of the type shown in box Y in FIG. 1. In addition, the FIG. 9 circuitry facilitates performance of multiple such operations (e.g., along a diagonal in FIG. 1) by efficiently supplying common multiplier bits to the multiple logic modules in a LAB.

Other modifications and functions described above in connection with FIG. 7 are equally applicable to FIG. 9. Similarly, the additional structure and enhancements shown in FIG. 8 and described above can also be applied to FIG. 9.

Figure 10:
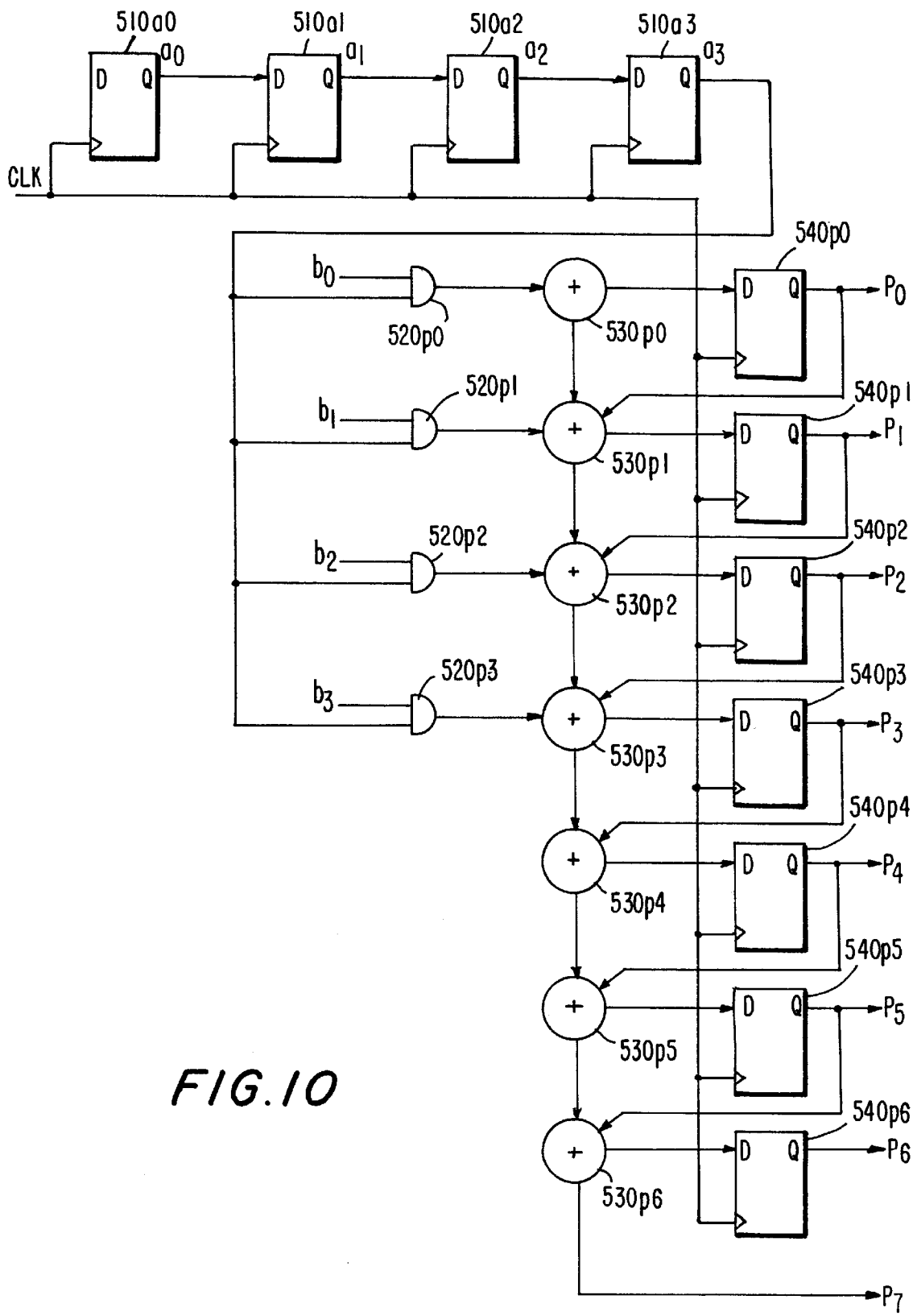
FIG. 10 is a logic diagram showing illustrative multiplier-accumulator logic in accordance with the invention.

FIG. 10 shows illustrative logic which can be used to perform a multiplication in a relatively small number of logic modules, some of which are augmented in accordance with this invention. The multiplication performed in the FIG. 10 logic is similar to the multiplication performed in FIG. 1 in the sense that the two multipliers $a_3-a_0$ and $b_3-b_0$ and the product $p_7-p_0$ are similarly identified and of similar size in both FIGS. However, FIG. 10 shows use of a multiplier-accumulator ("MAC") structure which accumulates successive partial results during several successive clock signal cycles until a final result is produced. Rather than being a full parallel multiplier as shown in FIG. 1, the FIG. 10 logic is a serial-parallel multiplier (i.e., all of the bits of one multiplier are applied in parallel, but the bits of the other multiplier are applied one after another in series during successive clock signal cycles).

Considering FIG. 10 now in detail, each of the four bits of multiplier $a_3-a_0$ is initially stored in a respective one of serially connected flip-flops 510a0–510a3. Each of the four bits of multiplier $b_3$–$b_0$ is applied to one input terminal of a respective one of ND gates 520p0–520p3. The Q output of the last of flip-flops 510 is applied in parallel to the other input terminal of each of AND gates 520. Initially this Q output is the most significant bit $a_3$ of multiplier $a_3$–$a_0$. The output signal of each of AND gates 520p0–520p3 is applied as an addend to a respective one of full adders 530p0–530p3. The sum out signal of each of adders 530p0–530p6 is applied to the data input terminal of a respective one of flip-flops 540p0–540p6. The carry out signal of each of adders 530p0–530p5 is applied as a carry in signal to the next more significant one of the adders, with the carry out signal of adder 530p6 being most significant product bit $p_7$. The Q output signal of each of flip-flops 540p0–540p5 is applied as second addend to the next more significant adder 530p1–530p6, respectively. Ultimately the Q outputs of flip-flops 540p0–540p6 are product bits $P_o$–$P_6$, respectively. All of flip-flops 510 and 540 are clocked in parallel by a common clock signal CLK. If desired, the carry out signal from adder 530p6 can be registered in another flip-flop 540p7 (not shown) so that at the end of the multiplication process all of the product bits will be similarly stored in registers 540. (The following discussion of FIG. 11 assumes that there is such a register S40p7 for the carry out output of adder 530p6.)

FIG. 11 shows the data that accumulates in flip-flops 540p0–540p7 after each successive clock signal pulse in an exemplary multiplication of $a_3$–$a_0$=1101=13 by $b_3$–$b_0$=1001=9 to produce product $p_7$–$p_0$=01110101=117. Initially (clock pulse column 0) all of flip-flops 540 contain 0. After clock pulse 1 flip-flops 540p0 and 540p3 contain 1 and all other flip-flops 540 contain 0. In addition, after clock pulse 1 the contents of flip-flops 510a0–510a3 have shifted one flip-flop stage to the right as viewed in FIG. 10 so that the Q output of flip-flop 510a3 is now multiplier bit $a_2$. After clock pulse 2, flip-flops 510p0, 540p1, 540p3, and 540p4 contain 1 and the other flip-flops 540 contain 0. In addition, after clock pulse 2 the output of flip-flop 510a3 is multiplier bit $a_1$. The multiplication process continues until after the fourth clock pulse when flip-flops 540p0–540p7 contain 1, 0, 1, 0, 1, 1, 1, and 0, respectively, which is the expected product (albeit with the bits listed in the reverse of the usual order (i.e., from least to most significant)).

It will be noted that only a relatively small number of logic modules (some of which are augmented in accordance with this invention as described earlier in this specification) is needed to implement the logic shown in FIG. 10. For example, each of the four groups of elements—of which 520p0, 530p0, and 540p0 are one representative group—can be implemented in one augmented logic module of the types shown, for example, in FIG. 3 or FIG. 7. In addition, the common multiplier bit feed 408 shown, for example, in FIGS. 7 or 8 can be used to apply multiplier bits $a_3$–$a_0$ to AND gates 520 in successive clock periods.

Figure 12:
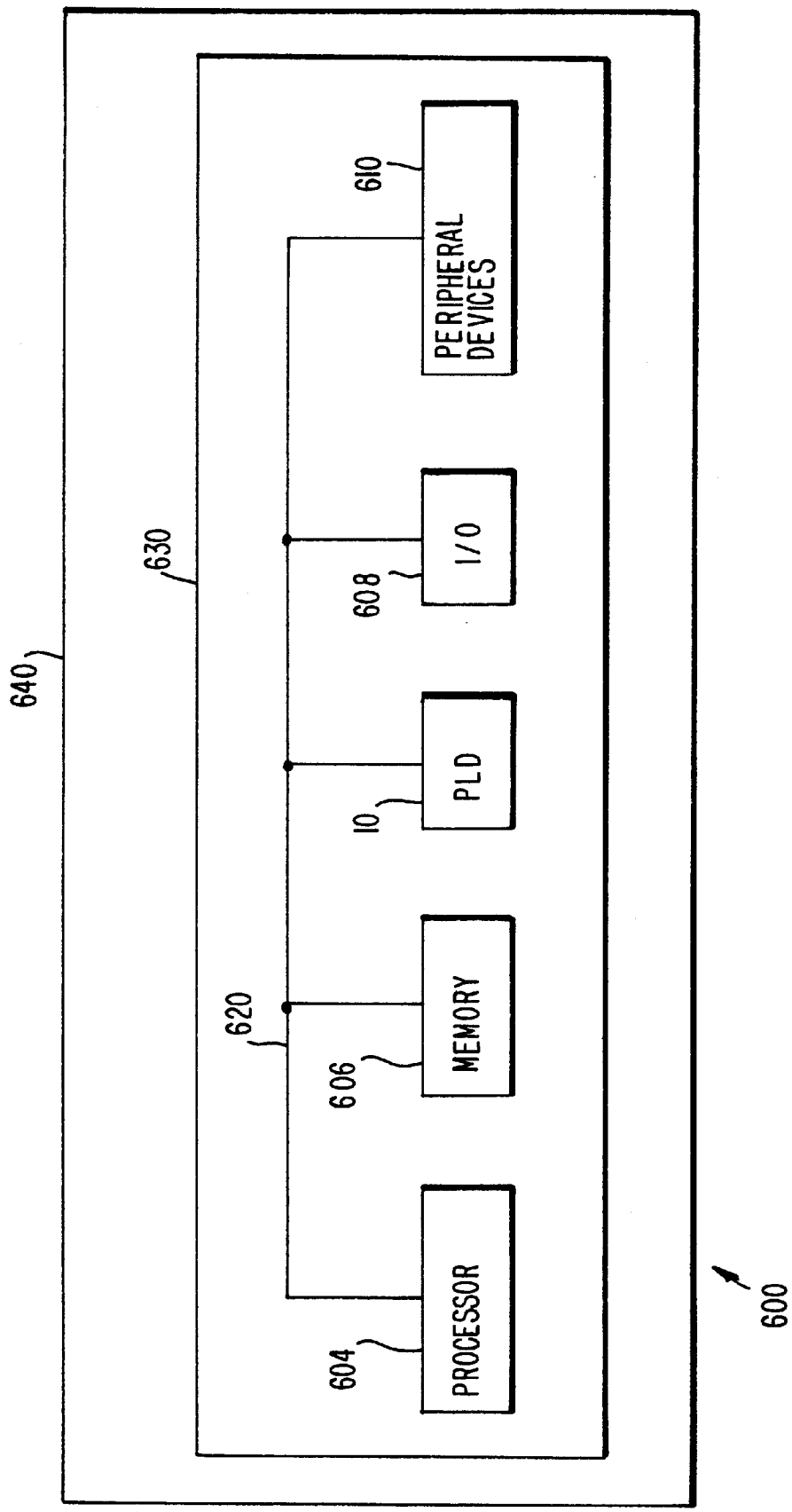
FIG. 12 is a simplified block diagram of an illustrative system employing a programmable logic device with improved multiplier circuitry in accordance with the invention.

FIG. 12 illustrates a programmable logic device 10 (which includes any circuitry in accordance with this invention as described above) in a data processing system 600. In addition to device 10, data processing system 600 may include one or more of the following components: a processor 604; memory 606; I/O circuitry 608; and peripheral devices 610. These components are coupled together by a system bus 620 and are populated on a printed circuit board 630 which is contained in an end-user system 640.

System 600 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 604. Programmable logic device 10 may also be used as an arbiter for arbitrating access to a shared resource in system 600. In yet another example, programmable logic device 10 can be configured as an interface between processor 604 and one of the other components in system 600. It should be noted that system 600 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) Like PLCs, FCEs can be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of this invention and that various modifications can be made by those skilled in the art without departing from the scope and spirit of the invention. For example, the particular basic logic module constructions shown herein are only exemplary, and different constructions can be used instead if desired.

What is claimed is:

1. A programmable logic device comprising:
   a plurality of programmable logic modules, each programmable logic module being programmable to perform a plurality of logic functions on a plurality of logic module input signals to produce a plurality of logic module output signals indicative of the logic function the programmable logic module has been programmed to perform, wherein each programmable logic module comprises:
   a plurality of programmable logic submodules, each programmable logic submodule being programmable to perform a plurality of programmable logic subfunctions on a plurality of submodule input signals to produce a submodule output signal indicative of the programmable logic subfunction the programmable logic submodule has been programmed to perform; and
   input signal processing circuitry comprising a logic subcircuit configured to combine two of the logic module input signals to produce a modified input signal for the programmable logic module, the modified input signal being indicative of a product of the two logic module input signals combined by the logic subcircuit.

2. The device defined in claim 1 wherein each programmable logic module further comprises register logic configured to register a signal within that programmable logic module and to produce a register output signal indicative of the signal thus registered.

3. The device defined in claim 2 wherein the input signal processing circuitry further comprises a plurality of programmable logic connectors that programmably selectively allow a subplurality of the logic module input signals to be used as submodule input signals for the programmable logic submodules.

4. A digital processing system comprising:
processing circuitry;
a memory coupled to said processing circuitry; and
a programmable logic device as defined in claim 1 and coupled to the processing circuitry and the memory.

5. A printed circuit board on which is mounted a programmable logic device as defined in claim 1.

6. The printed circuit board defined in claim 5 further comprising:
a memory mounted on the printed circuit board and coupled to the programmable logic device.

7. The printed circuit board defined in claim 6 further comprising:
processing circuitry mounted on the printed circuit board and coupled to the programmable logic device.

8. A programmable logic device comprising:
a plurality of programmable logic modules, each programmable logic module being programmable to perform a plurality of logic functions on a plurality of logic module input signals to produce a plurality of logic module output signals indicative of the logic function the programmable logic module has been programmed to perform, wherein each programmable logic module comprises:
a plurality of programmable logic submodules, each programmable logic submodule being programmable to perform a plurality of programmable logic subfunctions on a plurality of submodule input signals to produce a submodule output signal indicative of the programmable logic subfunction the programmable logic submodule has been programmed to perform;
register logic configured to register a signal within that programmable logic module and to produce a register output signal indicative of the signal thus registered; and
input signal processing circuitry comprising a logic subcircuit configured to combine two of the logic module input signals to produce a modified input signal for the programmable logic module, the modified input signal being indicative of a product of the two logic module input signals combined by the logic subcircuit, wherein the input signal processing circuitry further comprises a plurality of programmable logic connectors that programmably selectively allow a subplurality of the logic module input signals to be used as submodule input signals for the programmable logic submodules, and wherein the input signal processing circuitry further comprises a plurality of function control elements, each function control element being programmable to be in one of two states, wherein each programmable logic connector is associated with a respective one of the function control elements and is programmably configurable according to the state of its associated function control element.

9. The device defined in claim 8 wherein the logic subcircuit is associated with a respective one of the function control elements and is programmably configurable according to the state of its associated function control element.

10. The device defined in claim 9 wherein the respective states of the plurality of function control elements are programmable so that the programmable logic module can perform one place of full binary addition.

11. The device defined in claim 9 wherein the respective states of the plurality of function control elements are programmable so that the programmable logic module can perform both one place of binary multiplication and one place of full binary addition.

12. The device defined in claim 9 wherein the respective states of the plurality of function control elements are programmable so that the programmable logic module can perform as one stage of an accumulator.

13. The device defined in claim 9 wherein the respective states of the plurality of function control elements are programmable so that the programmable logic module can perform as one stage of a multiplier-accumulator.

14. The device defined in claim 9 wherein the respective states of the plurality of function control elements are programmable so that the programmable logic module can perform as one stage of a counter.

15. A programmable logic device comprising:
a plurality of logic modules, each logic module being configurable at least as a multiplier stage that performs both one place of binary multiplication and one place of binary addition, wherein each logic module includes:
a plurality of look-up tables, each look-up table being configurable to perform a look-up table function based on at least one of a plurality of data signals provided to the look-up table on a plurality of input leads associated with the plurality of look-up tables; and
input control logic coupled to the plurality of input leads, the input control logic being configured to combine at least a subplurality of the data signals to produce a modified input signal that is indicative of a product of the subplurality of data signals.

16. The device defined in claim 15, wherein the input control logic includes a plurality of programmable switching circuits and a plurality of combinatorial logic circuits.

17. The device defined in claim 16 wherein the plurality of programmable switching circuits and the plurality of combinatorial logic circuits are controlled by a plurality of function control elements, wherein the logic module is alternatively configurable as one stage of any of a plurality of different functional units based on different combinations of settings associated with the plurality of function control elements.

18. The device defined in claim 17 wherein the plurality of different functional units includes a counter, an accumulator, and a multiplier-accumulator.

19. A digital processing system comprising:
processing circuitry;
a memory unit; and
a programmable logic device as defined in claim 15, wherein the programmable logic device is coupled to the processing circuitry and the memory unit.

20. A printed circuit board on which is mounted a programmable logic device as defined in claim 15.

* * * * *